United States Patent
Lee

(10) Patent No.: US 8,071,970 B2
(45) Date of Patent: Dec. 6, 2011

(54) PHASE CHANGE MEMORY DEVICE AND FABRICATION METHOD THEREOF

(75) Inventor: Chien-Min Lee, Kaohsiung (TW)

(73) Assignees: ProMOS Technologies Inc., Hsinchu (TW); Winbond Electronics Corp., Taichung County (TW)

( * ) Notice: Subject to any disclaimer, the term of this patent is extended or adjusted under 35 U.S.C. 154(b) by 0 days.

(21) Appl. No.: 12/328,745

(22) Filed: Dec. 4, 2008

(65) Prior Publication Data

US 2009/0078926 A1    Mar. 26, 2009

Related U.S. Application Data

(62) Division of application No. 11/615,909, filed on Dec. 22, 2006, now Pat. No. 7,538,043.

(30) Foreign Application Priority Data

Jun. 26, 2006 (TW) ................ 95122930 A

(51) Int. Cl.
*H01L 47/00* (2006.01)

(52) U.S. Cl. ..................... 257/4; 257/2; 257/3

(58) Field of Classification Search .......... 257/4, 68–71, 257/E27.098–E27.101, 296–309, 905–908, 257/E27.084–E27.097, E27.075

See application file for complete search history.

(56) References Cited

U.S. PATENT DOCUMENTS

| | | | | |
|---|---|---|---|---|
| 3,820,150 | A * | 6/1974 | Nicolaides | 257/4 |
| 4,946,501 | A * | 8/1990 | Nate et al. | 75/246 |
| 6,813,031 | B1 | 11/2004 | Poris et al. | |
| 7,829,876 | B2 * | 11/2010 | Lung | 257/2 |
| 2006/0011902 | A1* | 1/2006 | Song et al. | 257/4 |
| 2006/0046509 | A1* | 3/2006 | Gwan-Hyeob | 438/758 |
| 2006/0113573 | A1* | 6/2006 | Cheong et al. | 257/246 |
| 2006/0223268 | A1 | 10/2006 | Moriya et al. | |
| 2006/0226409 | A1* | 10/2006 | Burr et al. | 257/2 |
| 2007/0034905 | A1* | 2/2007 | Elkins | 257/211 |
| 2007/0154847 | A1 | 7/2007 | Chen et al. | |
| 2007/0215852 | A1 | 9/2007 | Lung | |

OTHER PUBLICATIONS

A. L. Lacaita et al, "Electrothermal and phase-change dynamics in chalcogenide-based memories", IEEE, 2004, USA.

S.L. Cho et al, Highly Scalable On-axis Confined Cell Structure for High Density PRAM beyond 256Mb, 2005, Symposium on VLSI Digest of Technical Papers, pp. 96-97.

Jonathan D. Maimon et al, "Chalcogenide Memory Arrays: Characterization and Radiation Effects", Dec. 2003, pp. 1878-1884. vol. 50, No. 6, IEEE Transactions on Nuclear Science, USA.

* cited by examiner

*Primary Examiner* — Wai Sing Louie
*Assistant Examiner* — Bilkis Jahan

(57) ABSTRACT

A phase change memory device comprising an electrode, a phase change layer crossing and contacting the electrode at a cross region thereof, and a transistor comprising a source and a drain, wherein the drain of the transistor electrically connects the electrode or the phase change layer is disclosed.

2 Claims, 20 Drawing Sheets

PHASE CHANGE MEMORY DEVICE AND FABRICATION METHOD THEREOF

This application is a divisional of U.S. application Ser. No. 11/615,909, filed Dec. 22, 2006, the entire disclosure of which is hereby incorporated by reference.

BACKGROUND OF THE INVENTION

1. Field of the Invention

The invention relates to a memory device and fabrication thereof, and in more particularly to a phase change memory device and a fabrication thereof.

2. Description of the Related Art

Phase change memory devices have many advantages, such as high speed, lower power consumption, high capacity, greater endurance, better process integrity and lower cost. Thus, phase change memory devices can serve as independent or embedded memory devices with high integrity. Due to the described advantages, phase change memory devices can substitute for volatile memory devices, such as SRAM or DRAM, and non-volatile memory devices, such as Flash memory devices.

FIG. 1A shows a conventional T-shaped phase change memory device. Referring to FIG. 1A, a conventional T-shaped phase change memory device sequentially comprises a bottom electrode 102, a heating electrode 104, a phase change layer 106 and a top electrode 108 with the cylinder-shaped heating electrode 104 contacting the phase change layer 106. The dimensions of the contact region 110 between the heating electrode 104 and the phase change layer 106 is determined according to dimensions of the heating electrode 104, such that controlling the dimensions of the contact region 110 is difficult. In addition, fabrication of the heating electrode 104 of the T-shaped phase change memory device at least comprises forming an opening utilizing etching, filling the opening with conductive materials and chemical mechanical polishing the conductive materials. The process is relatively complicated, and quality of the heating electrode 104 formed thereby is inadequate.

FIG. 1B shows a cross section of another conventional phase change memory cell with a confined structure. In FIG. 1B, an opening between spacers 158 overlying a bottom electrode 152 and a heating electrode 154 is filled with phase change layer 156 to form a via 160. The phase change layer 156 connects the heating electrode 154 through the via 160. Via 160, however, must be formed as an arc-shaped using a spacer process, such that phase change layer 156 can be more easily filled into the opening between the spacers 158 when via 160 is formed. Currently, plasma vapor deposition or evaporation is utilized to fill the opening with phase change materials when forming via 160. It is very difficult, however, to achieve via 160 without defects.

BRIEF SUMMARY OF INVENTION

According to the problems described, the invention is to provide a phase change memory device capable of easier control of dimensions of a cross region between an electrode and a phase change layer. Another objective of the invention is to provide a phase change memory device with heating electrodes formed by direct etching, in which gap filling is not used, such that an electrode with better quality could be achieved. Further another objective of the invention is to provide a method for forming a phase change memory device, a phase change layer self-formed as a confined structure by over-etching and/or CMP erosion, in which the step of forming an arc-shaped via is not used. Thus, issues of difficult gap filling using phase change materials and bad electrode quality from gap filling a metal with chemical vapor deposition could be eliminated.

An embodiment of a phase change memory device comprises an electrode, a phase change layer crossing and contacting the electrode at a cross region thereof, and a transistor comprising a source and a drain, wherein the drain of the transistor electrically connects the electrode or the phase change layer.

The invention further provides a method for forming a phase change memory device, comprising: providing a substrate, comprising a transistor with a source or a drain formed therein; forming a bottom dielectric layer with vias therein overlying the substrate, the vias electrically connecting the source or the drain of the transistor; forming a first dielectric layer with a lower electrode therein overlying the bottom dielectric layer and vias; forming a second dielectric layer with a phase change layer therein overlying the first dielectric layer and the lower electrode, the phase change layer crossing and contacting the lower electrode at a cross region; and forming a top electrode, electrically connecting the phase change layer.

Another embodiment of a phase change memory device comprises an electrode, a phase change layer crossing and contacting the electrode at a cross region thereof, and a transistor comprising a source and a drain, wherein the drain of the transistor electrically connects the electrode or the phase change layer and the phase change layer is confined to the electrode in a direction along the phase change layer.

Another embodiment of a phase change memory device comprises an electrode, a phase change layer crossing and contacting the electrode at a cross region thereof, and a transistor comprising a source and a drain, wherein the drain of the transistor electrically connects the electrode or the phase change layer and the electrode is confined to the phase change layer in a direction along the electrode.

BRIEF DESCRIPTION OF DRAWINGS

The invention can be more fully understood by reading the subsequent detailed description and examples with references made to the accompanying drawings, wherein:

FIG. 2A~FIG. 9A shows intermediate plan views of fabrications of a phase change memory device of an embodiment of the invention.

FIG. 2B~FIG. 9B shows cross sections along line I-I' of FIG. 2A~FIG. 9A.

FIG. 2C~FIG. 9C shows cross sections along line II-II' of FIG. 2A~FIG. 9A.

DETAILED DESCRIPTION OF INVENTION

Figure 1A:
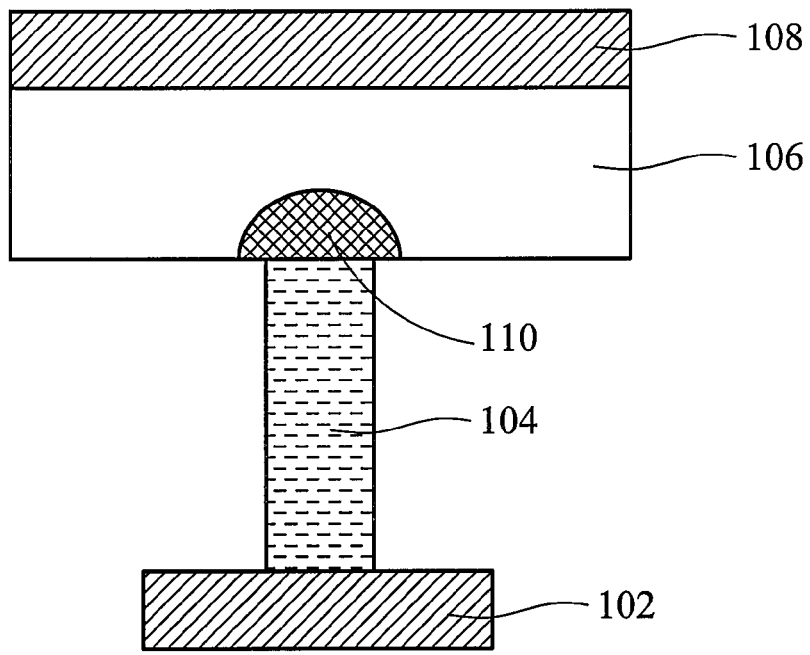
FIG. 1A shows a conventional T-shaped phase change memory device.
Figure 1B:
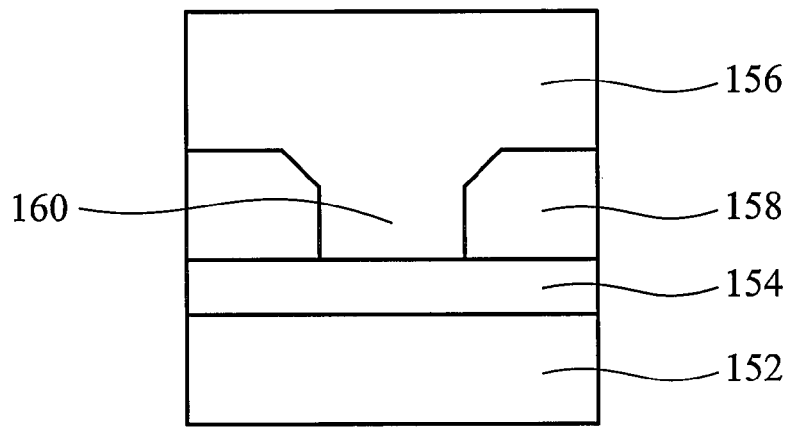
FIG. 1B shows a cross section of another conventional phase change memory cell with a confined structure.

The following description is of the best-contemplated mode of carrying out the invention. This description is made for the purpose of illustrating the general principles of the invention and should not be taken in a limiting sense. The scope of the invention is best determined by reference to the appended claims. Embodiments of the invention, which provides a phase change memory device, will be described in greater detail by referring to the drawings that accompany the invention. It is noted that in the accompanying drawings, like and/or corresponding elements are referred to by like reference numerals.

Figure 2A:
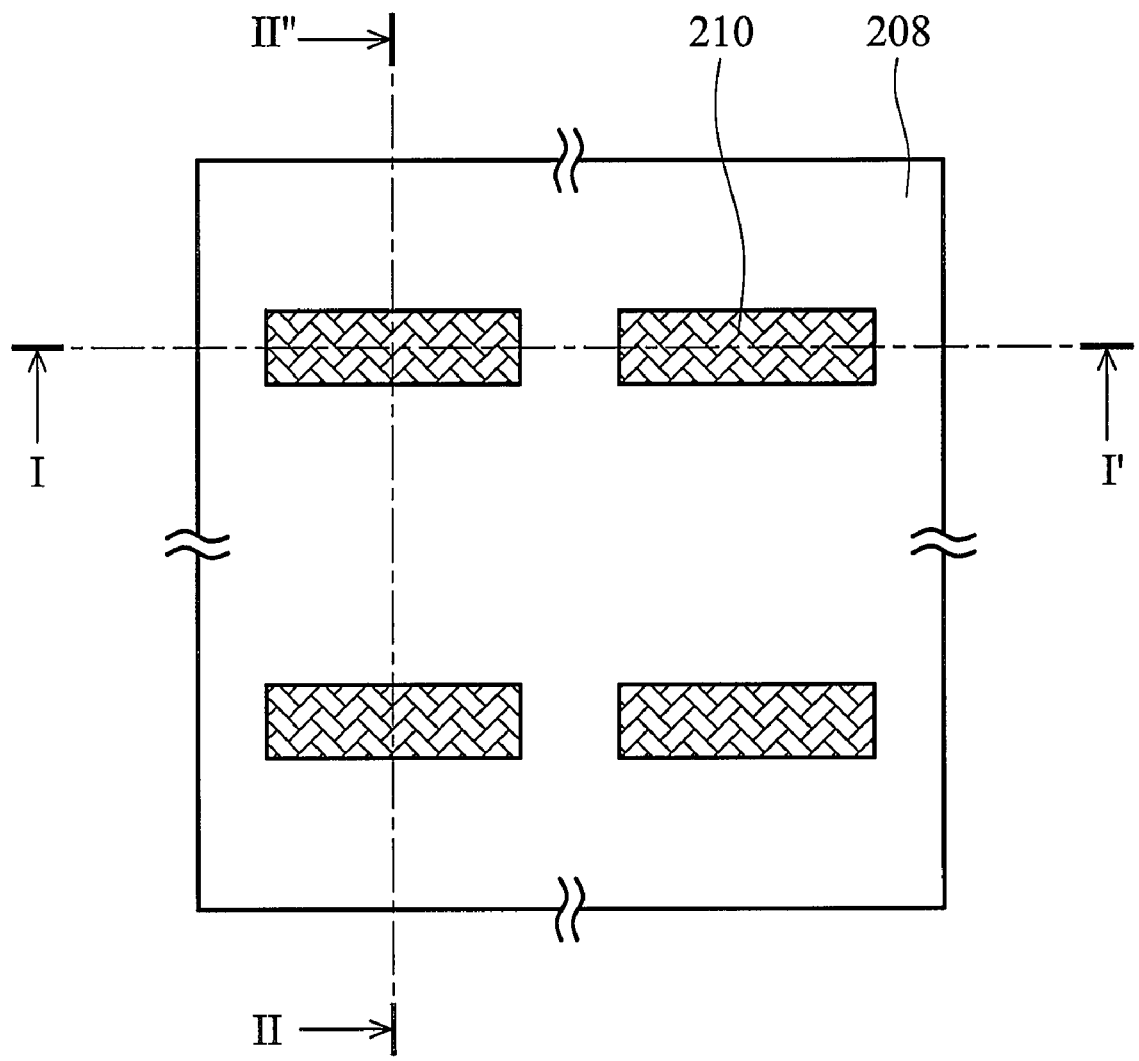
Figure 2B:
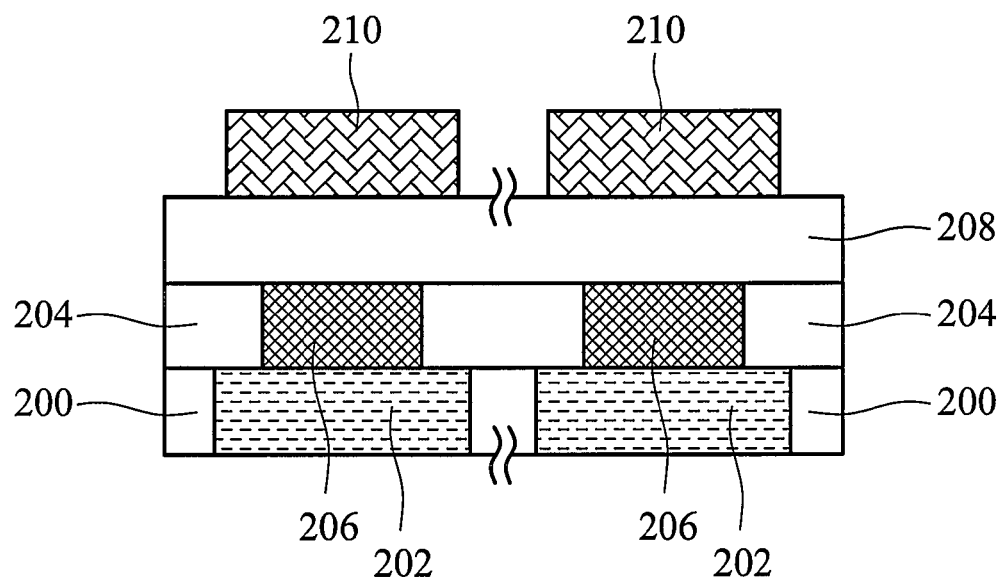
Figure 2C:
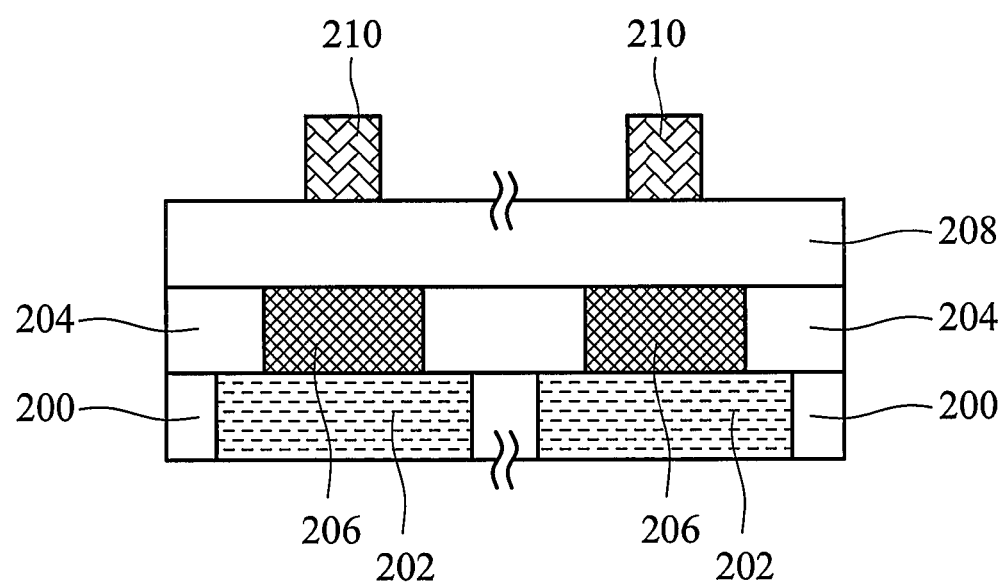

FIG. 2A~FIG. 9A show intermediate plan views of fabrications of a phase change memory device of an embodiment of the invention. FIG. 2B~FIG. 9B shows cross sections along line I-I' of FIG. 2A~FIG. 9A. FIG. 2C~FIG. 9C shows cross sections along line II-II' of FIG. 2A~FIG. 9A. Referring to FIG. 2A, FIG. 2B and FIG. 2C, a substrate 200 comprising a transistor is provided, in which the transistor comprises a gate (not shown), a source (not shown) and a drain 202. A bottom dielectric layer 204 is formed on the transistor. A via 206 is formed in the bottom dielectric layer 204, connecting the drain 202 of the transistor.

A first metal layer 208, comprising elements, such as, rare earth elements, rare earth element nitride, transition metal element nitride, rare earth element carbide, transition metal element carbide or other refractory materials, is formed on the via 206 and the bottom dielectric layer 204. The first metal layer 208 can be metal, such as W, Mo or Ta, or metal nitride, such as TaN or TiN. Next, a first patterned photoresist layer 210 is formed on the first metal layer 208 by typical photolithography. Thereafter, a trimming process can be utilized to reduce the dimensions of the first patterned photoresist layer 210, such that width and length of a strip-shaped electrode defined by the trimmed first patterned photoresist layer 210 can be reduced. Note that mask for defining a strip-shaped electrode is not limited to the trimmed first patterned photoresist layer 210.

Figure 3A:
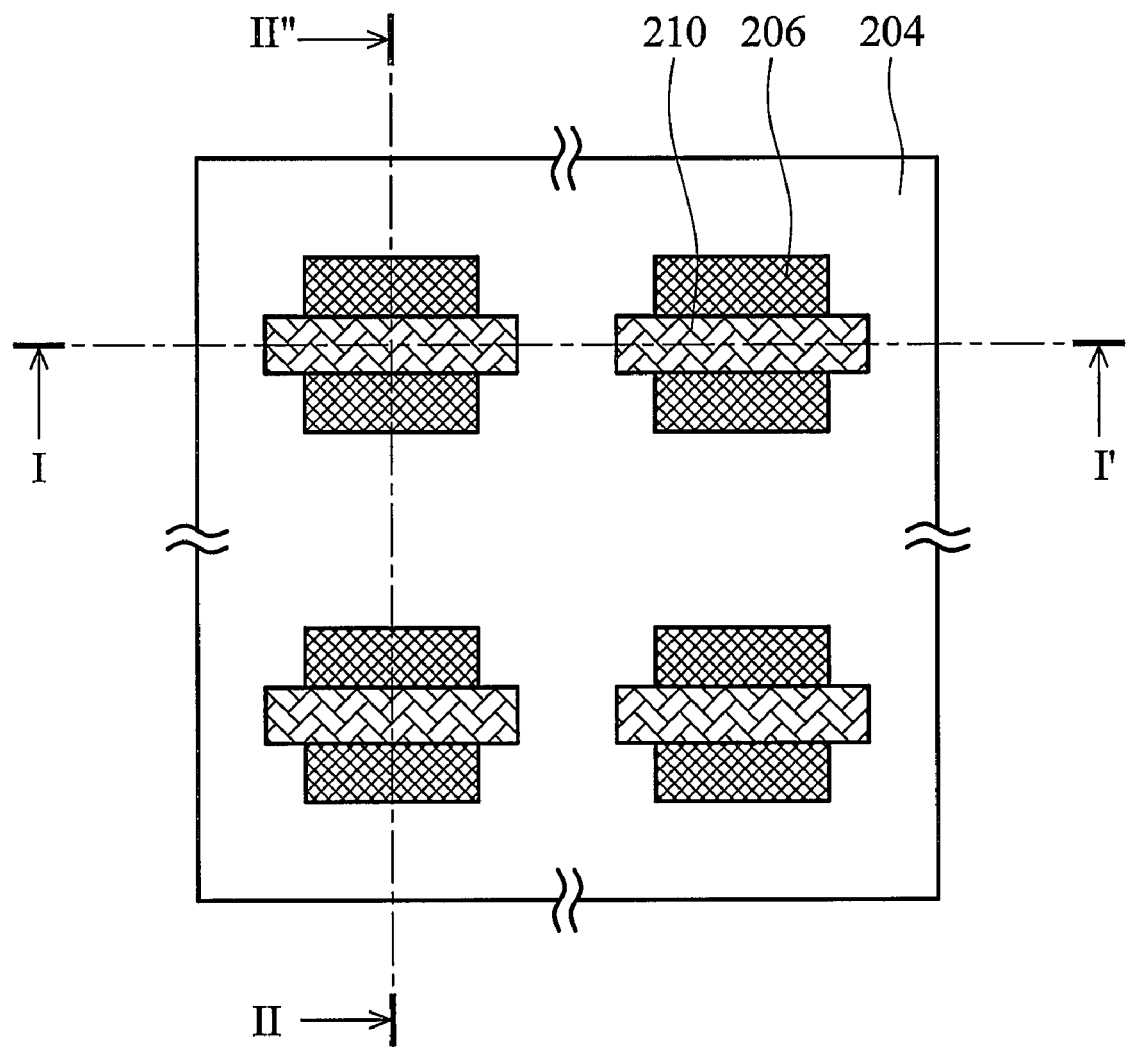
Figure 3B:
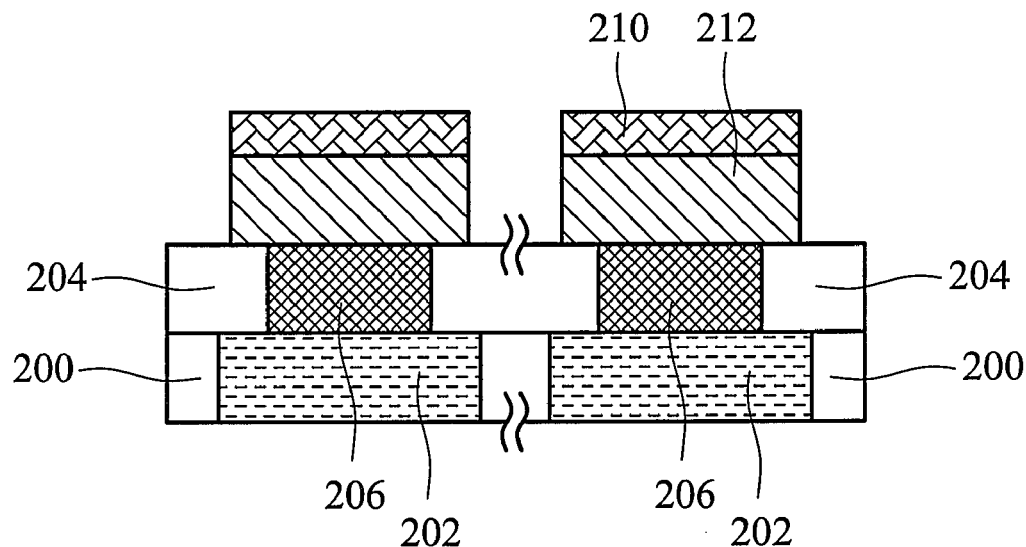
Figure 3C:
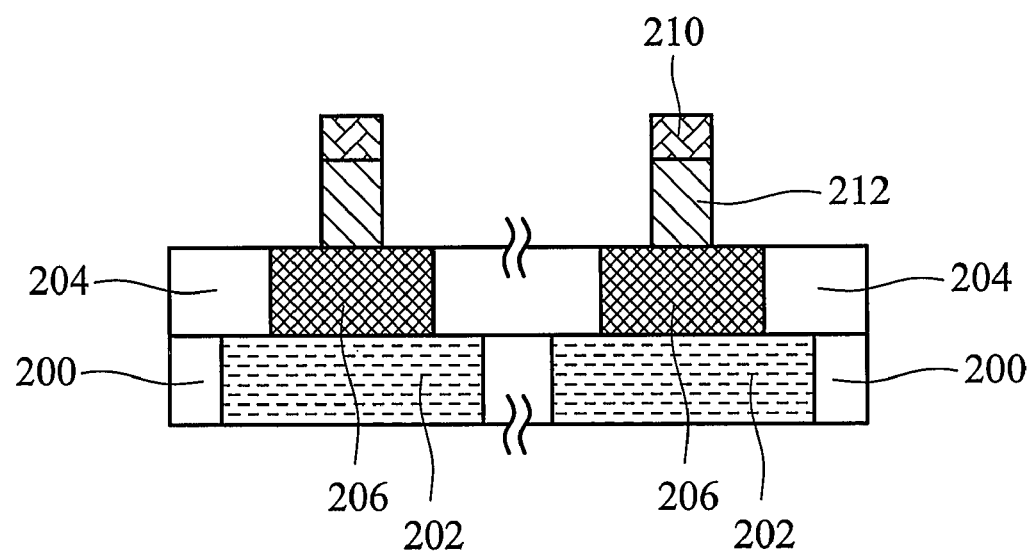

Referring to FIG. 3A, FIG. 3B and FIG. 3C, the first metal layer 208 is etched using the first patterned photoresist layer 210 as a mask to form a strip-shaped electrode 212 extending along a first direction. Note that because the trimming process reduces the dimensions of the patterned first photoresist layer 210, the strip-shaped electrode 212 defined by the trimmed first photoresist layer 210 is shorter and thinner. Next, the trimmed first photoresist layer 210 is removed. Thereafter, referring to FIG. 4A, FIG. 4B and FIG. 4C, a first dielectric layer 214 is deposited on the strip-shaped electrode 212, via 206 and bottom dielectric layer 204, and then polished by chemical mechanical polishing until the strip-shaped electrode 212 is exposed.

Figure 5A:
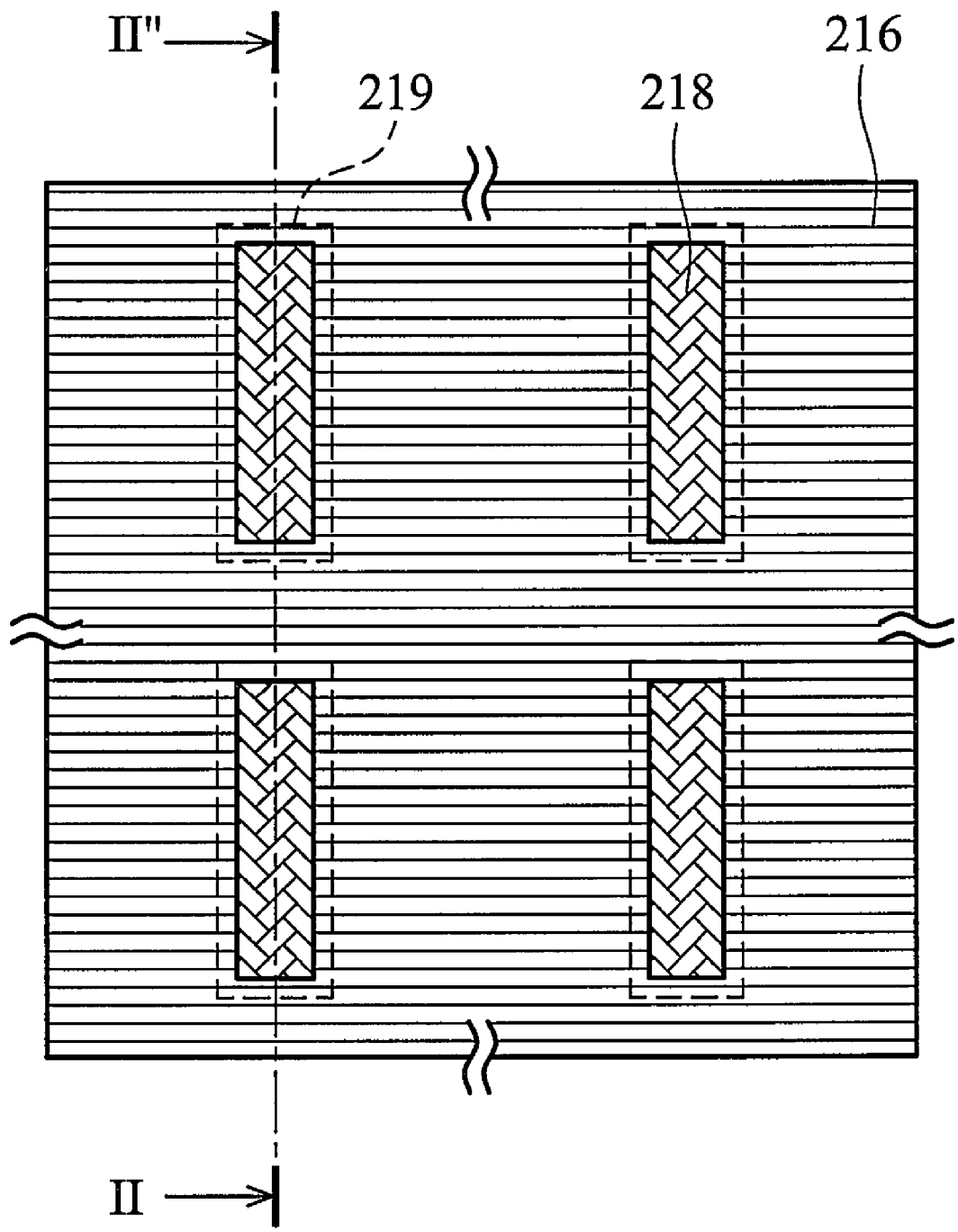
Figure 5B:
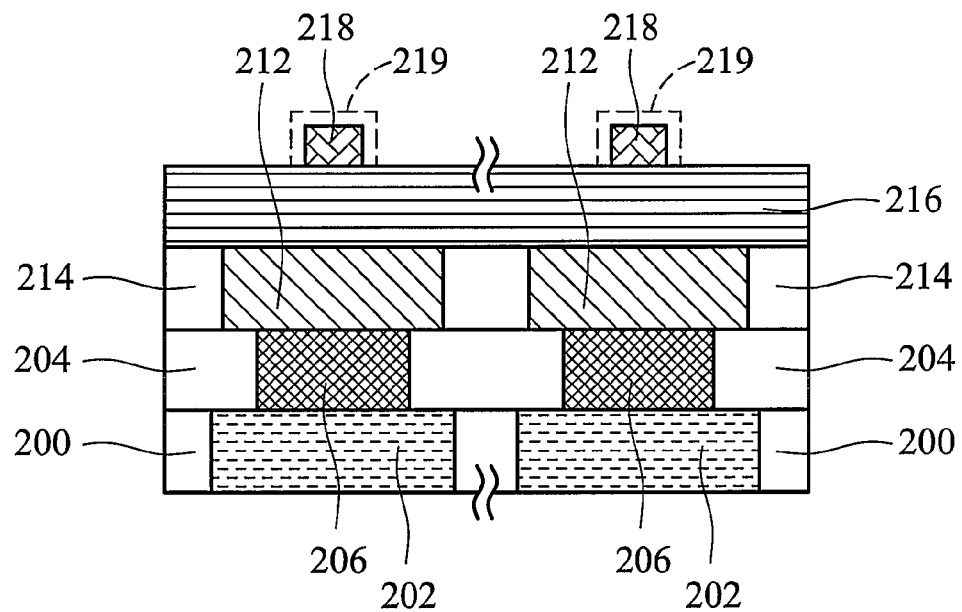
Figure 5C:
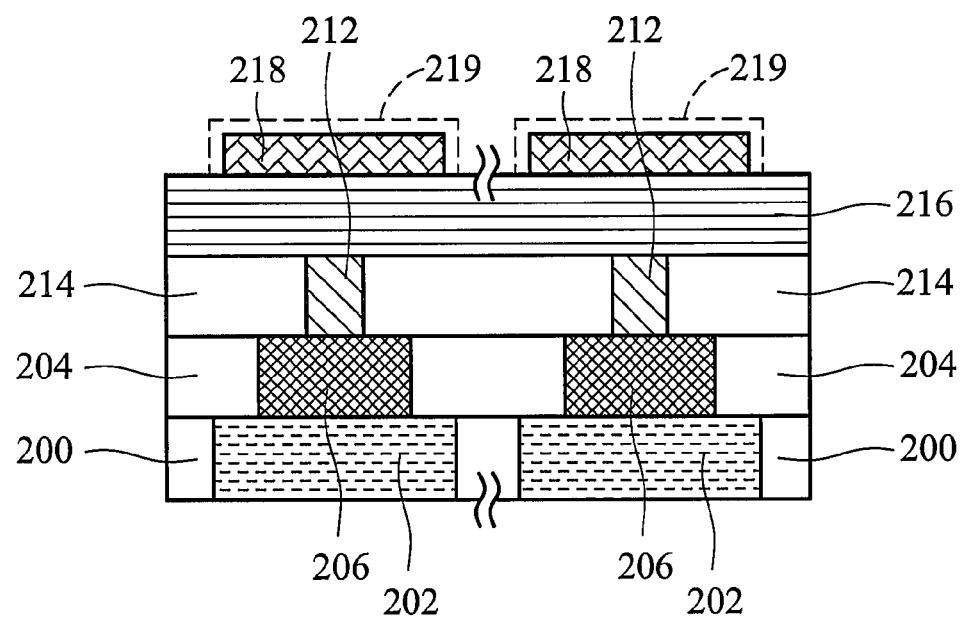

Referring to FIG. 5A, FIG. 5B and FIG. 5C, a phase change layer 216 is blanketly deposited on the strip-shaped electrode 212 and the first dielectric layer 214. In an embodiment of the invention, the phase change layer 216 comprises materials capable of numerous stable phase changes. Preferably, the phase change layer 216 is formed of materials selected from the group consisting of elements of groups of III, IV, V, VI alloy mainly comprising Sb or Te or combinations thereof. For example, the phase change layer 216 can be ternary chalcogenides, such as compositions along GeTe—$Sb_2Te_3$ tieline, or multi-element alloy comprising Sb—Te with a ratio to achieve a eutectic state to which a small amount of dopant is added. Next, a photoresist 219 is formed on the phase change layer 216 by a typical photolithography process. Thereafter, a trimming process is utilized to reduce the width of the photoresist 219 to form a second patterned photoresist 218. Preferably, the second patterned photoresist 218 is strip-shaped and perpendicular to the strip-shaped electrode 212. Note that the mask used to define a strip-shaped phase change layer is not limited to the second patterned photoresist 218 described.

Figure 6A:
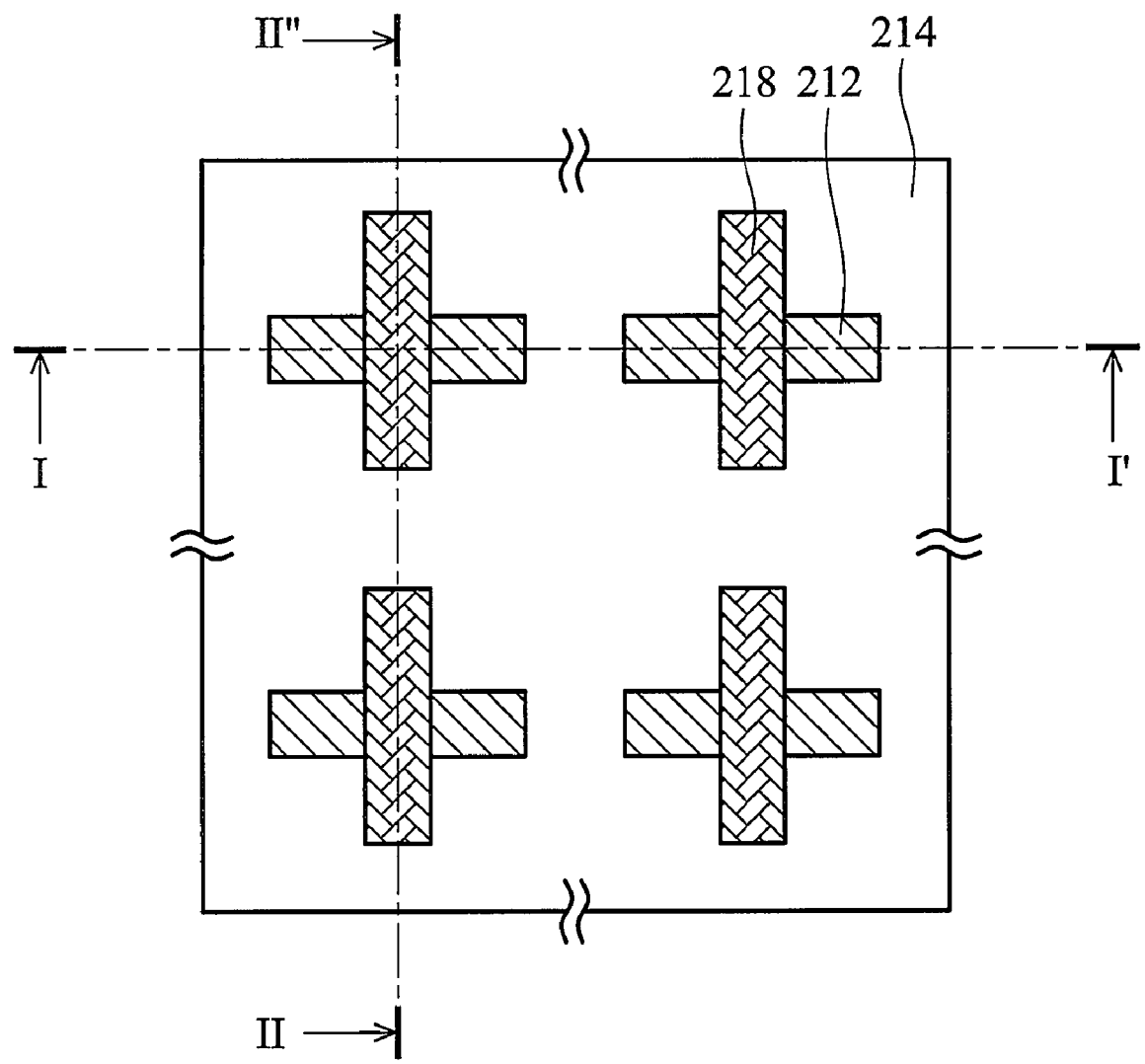
Figure 6B:
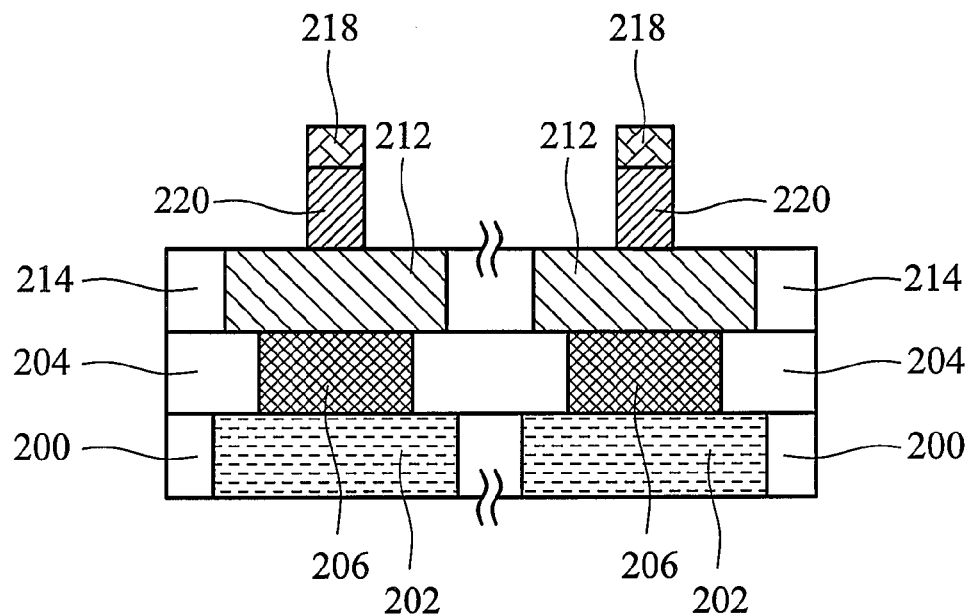
Figure 6C:
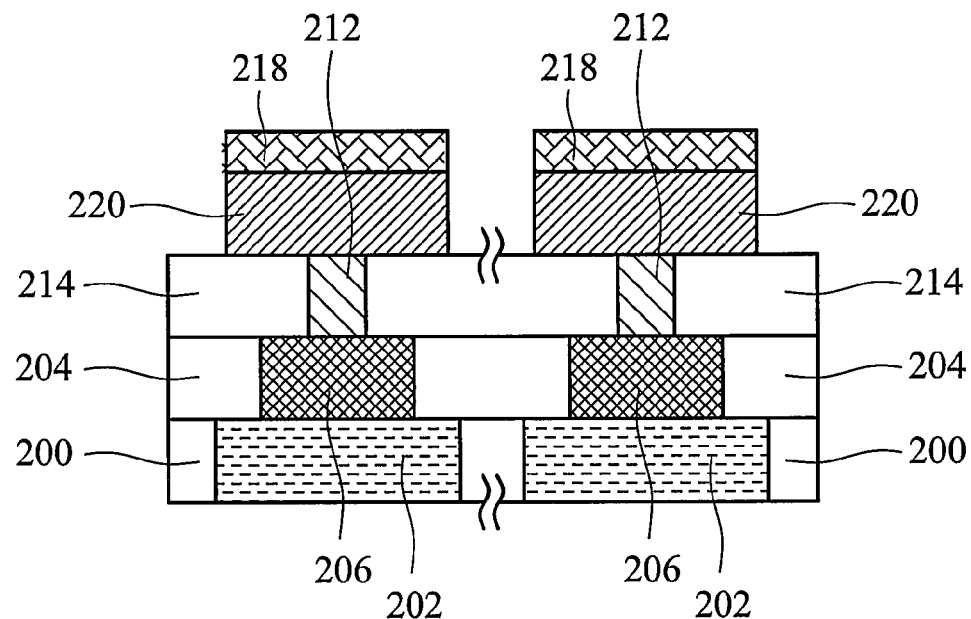

Referring to FIG. 6A, FIG. 6B and FIG. 6C, the phase change layer 216 is etched using the second patterned photoresist 218 as a mask to form a strip-shaped phase change layer 220 extending along a second direction. Preferably, the second direction is perpendicular to the first direction.

Figure 7A:
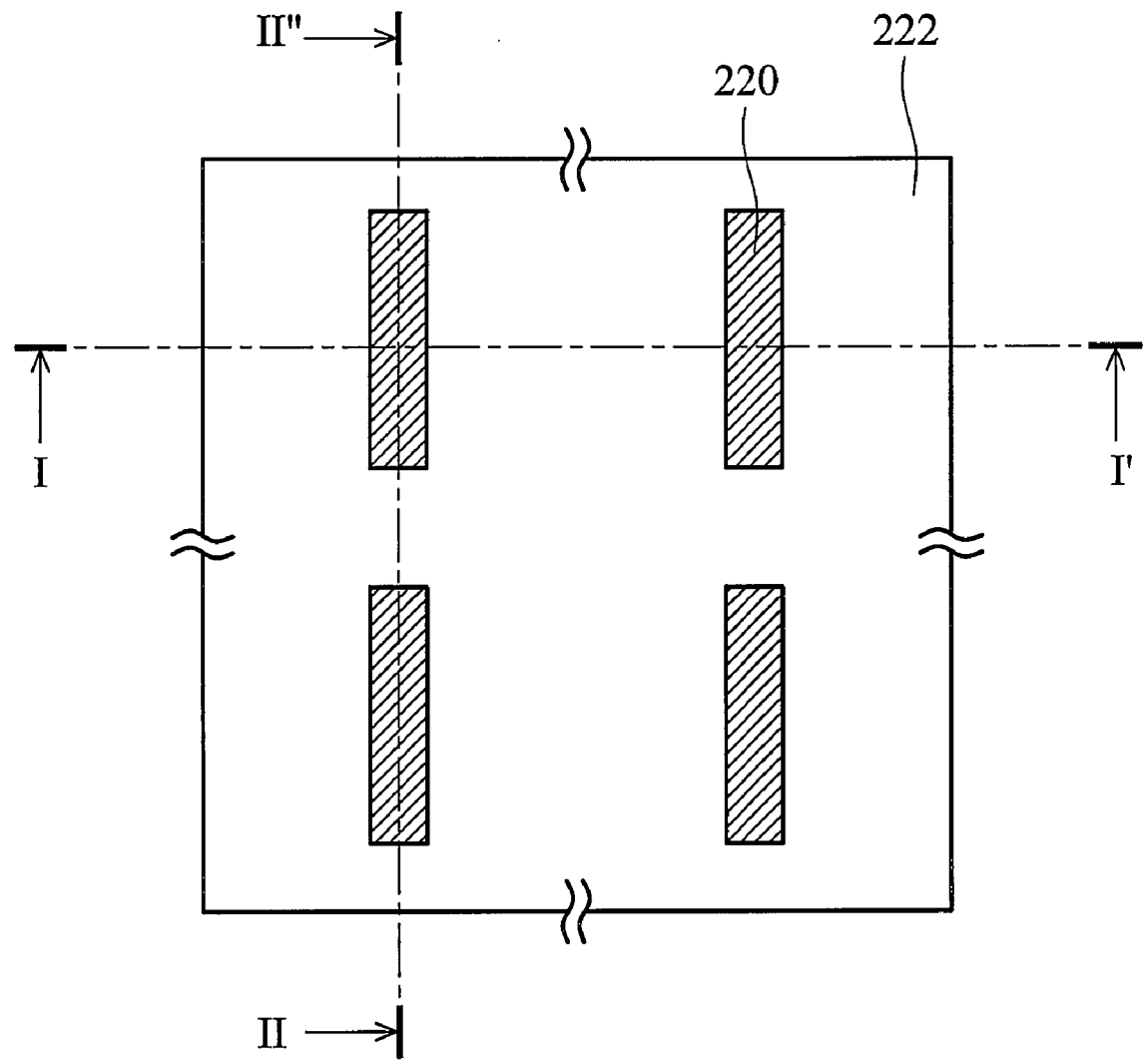
Figure 7B:
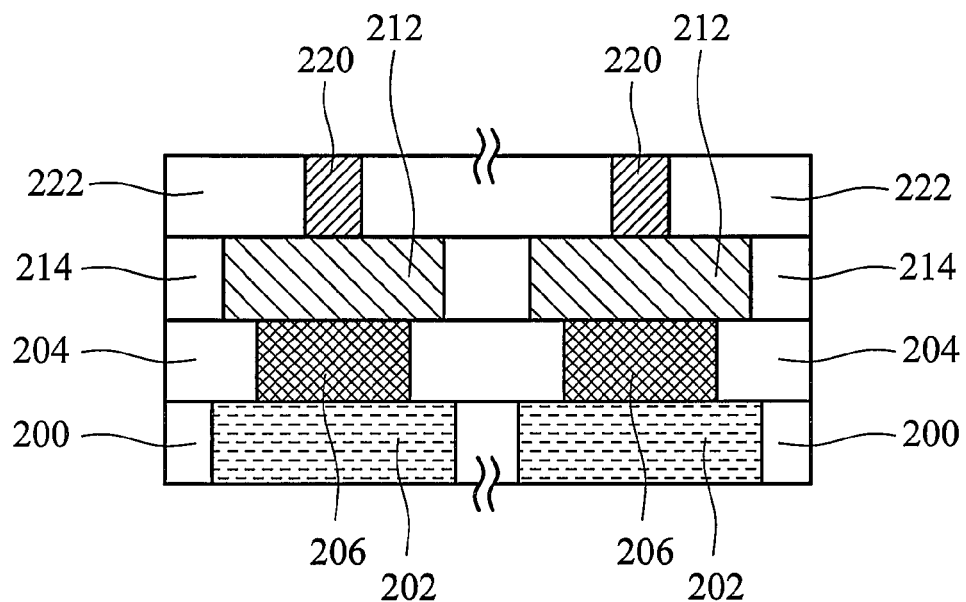
Figure 7C:
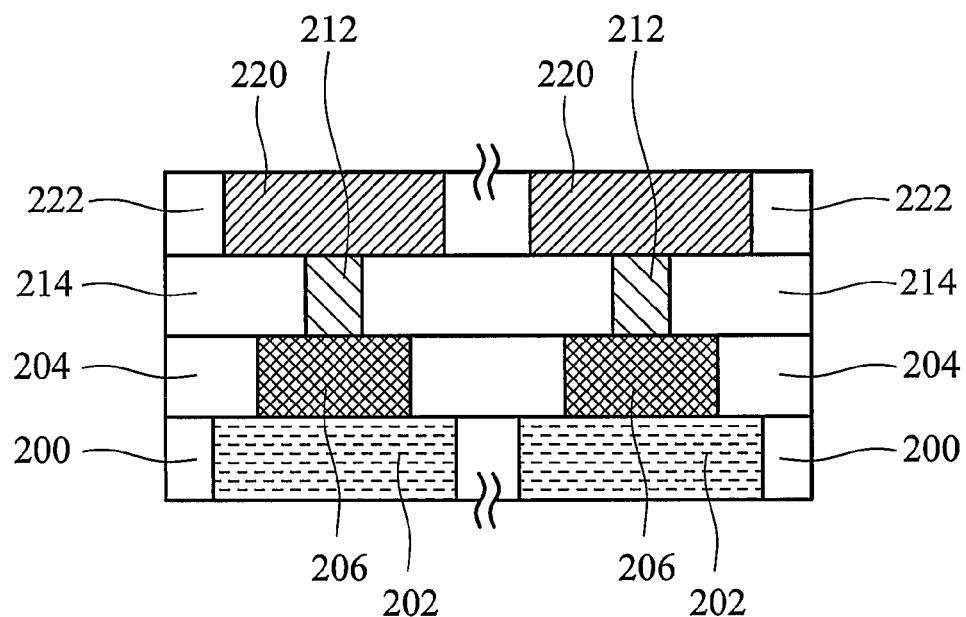
Figure 10:
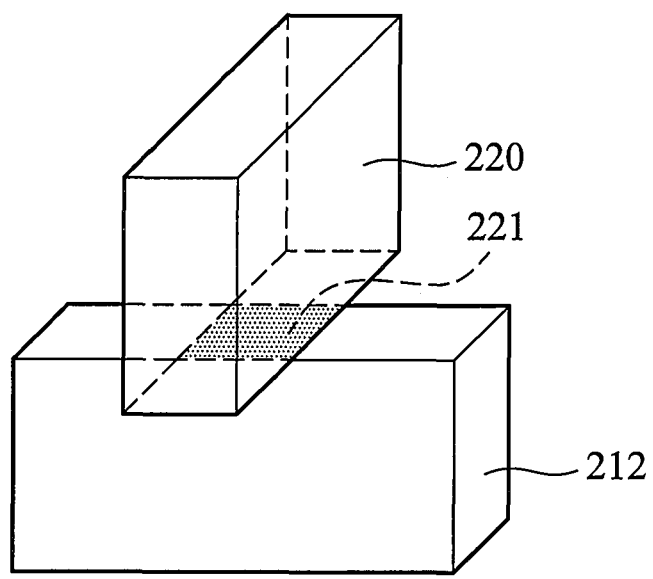
FIG. 10 shows a three dimensional view of a phase change memory device of an embodiment of the invention.

Referring to FIG. 7A, FIG. 7B and FIG. 7C, the second patterned photoresist 218 is removed, and a second dielectric layer 222, such as silicon nitride, silicon oxide or silicon oxynitride, is then deposited on the strip-shaped phase change layer 220, the first dielectric layer 214 and the strip-shaped electrode 212. Next, the second dielectric layer 222 is polished by chemical mechanical polishing until the strip-shaped phase change layer 220 is exposed. Thus, as shown in FIG. 10, a structure comprising strip-shaped phase change layer 220 crossing and contacting a strip-shaped electrode 212 is formed. Note that the area of a cross region 221 between the strip-shaped phase change layer 220 and the strip-shaped electrode 212 is determined by both the strip-shaped phase change layer and a strip-shaped electrode, such that control of dimension of the cross region 221 is easier, and a one dimensional confined structure can be achieved without requiring a specific deposition apparatus. Preferably the strip-shaped electrode 212 crosses the strip-shaped phase change layer 220 perpendicularly to minimize contact region 221. More preferably, since the strip-shaped electrode 212 crosses the strip-shaped phase change layer 220, the dimensions of the contact region 221 do not vary substantially depending on where the strip-shaped electrode 212 contacts the strip-shaped phase change layer 220. Additionally, an area of the cross region 212 is substantially independent of the location of the cross region 212.

Figure 8A:
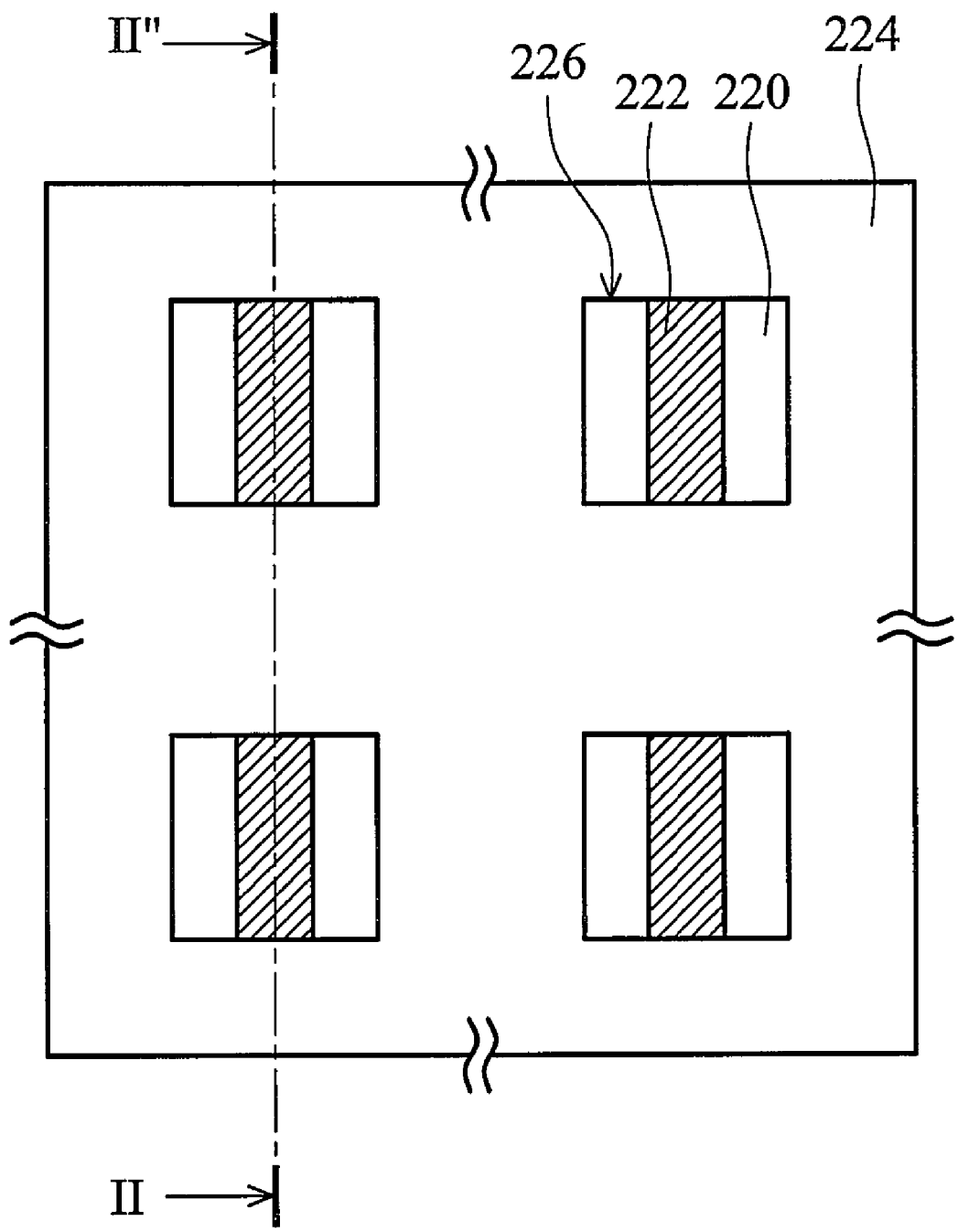
Figure 8B:
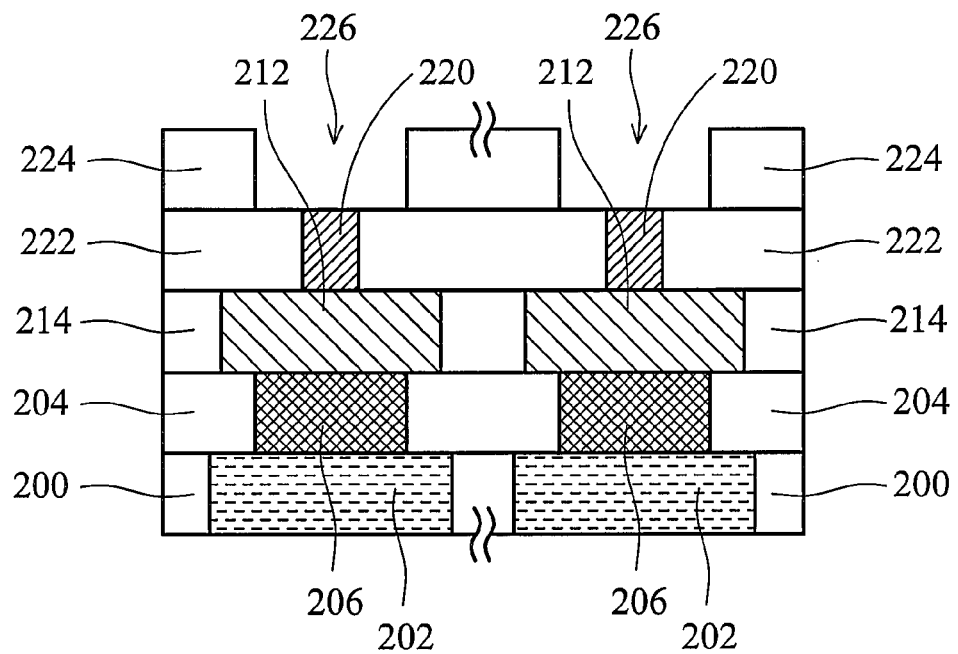
Figure 8C:
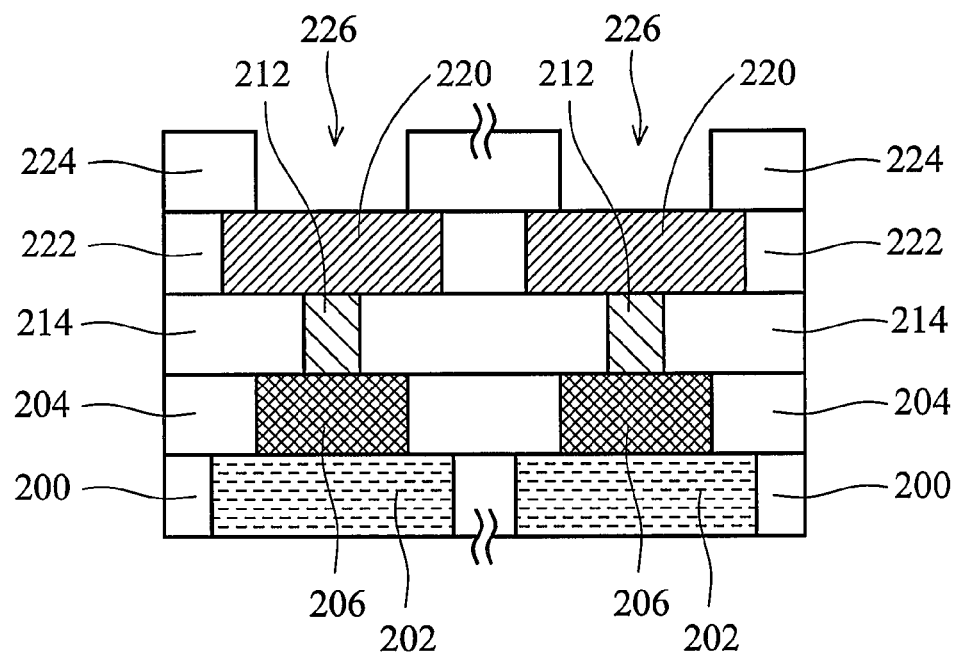
Figure 9A:
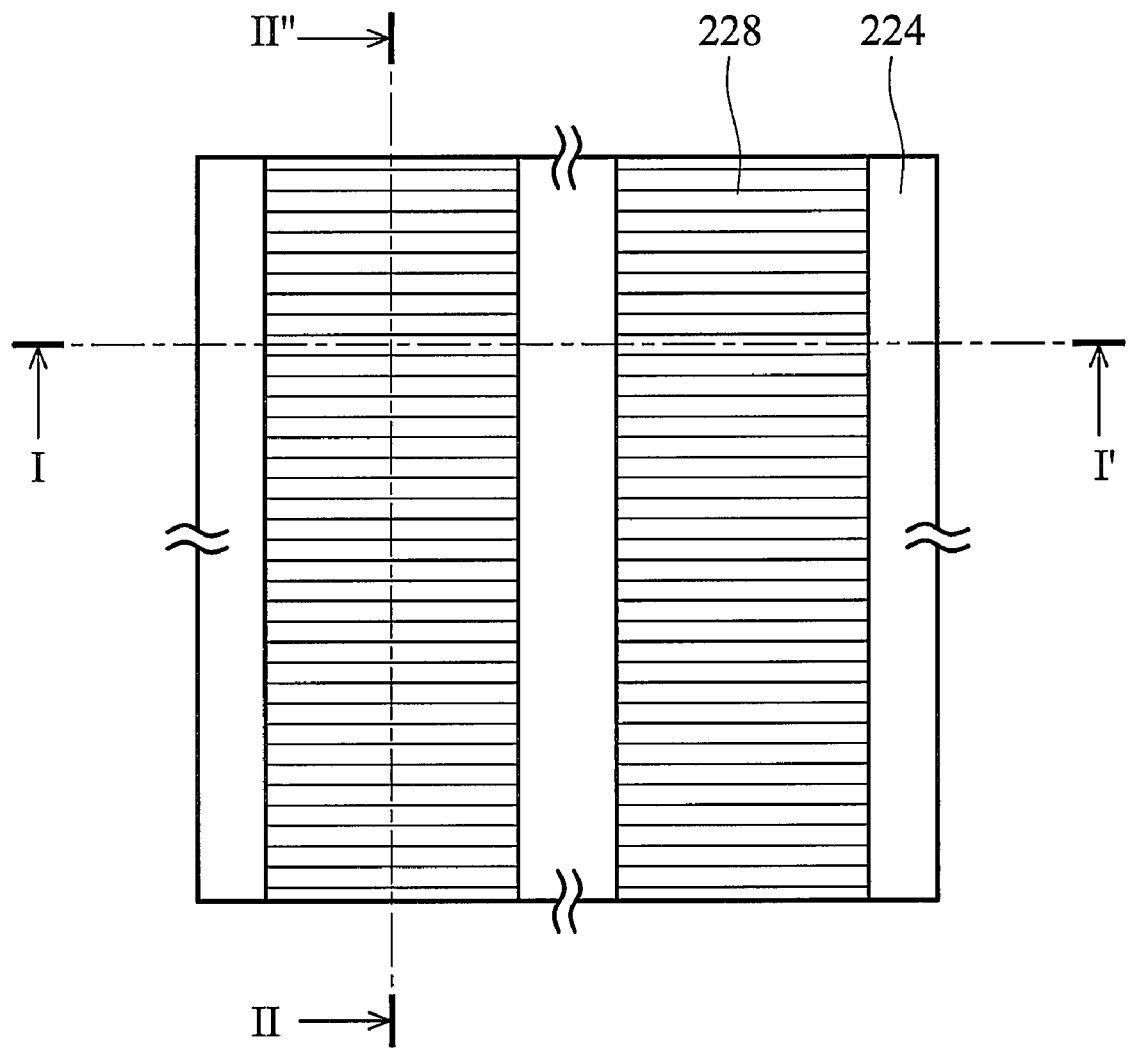
Figure 9B:
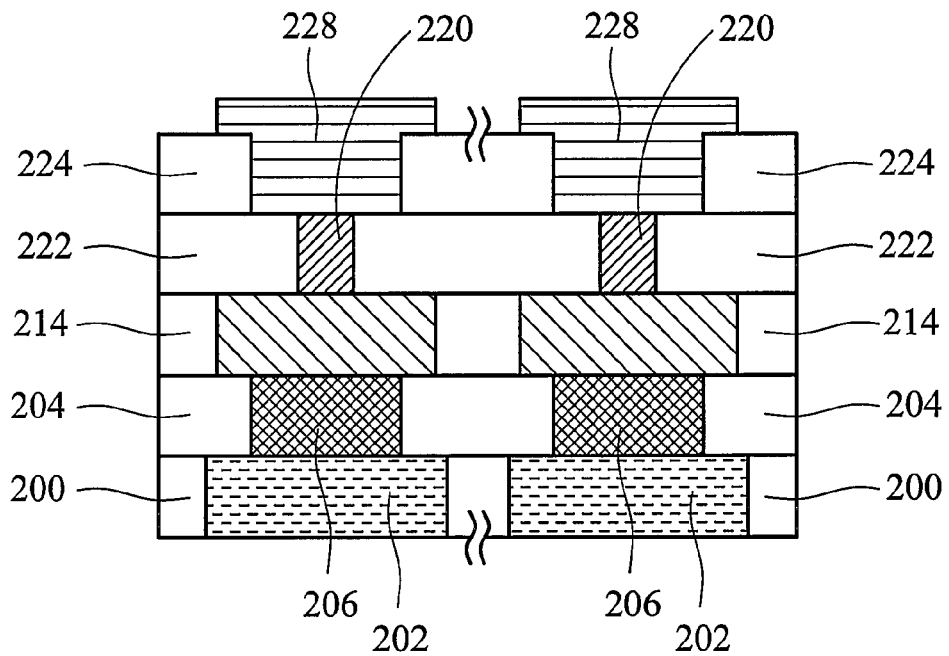
Figure 9C:
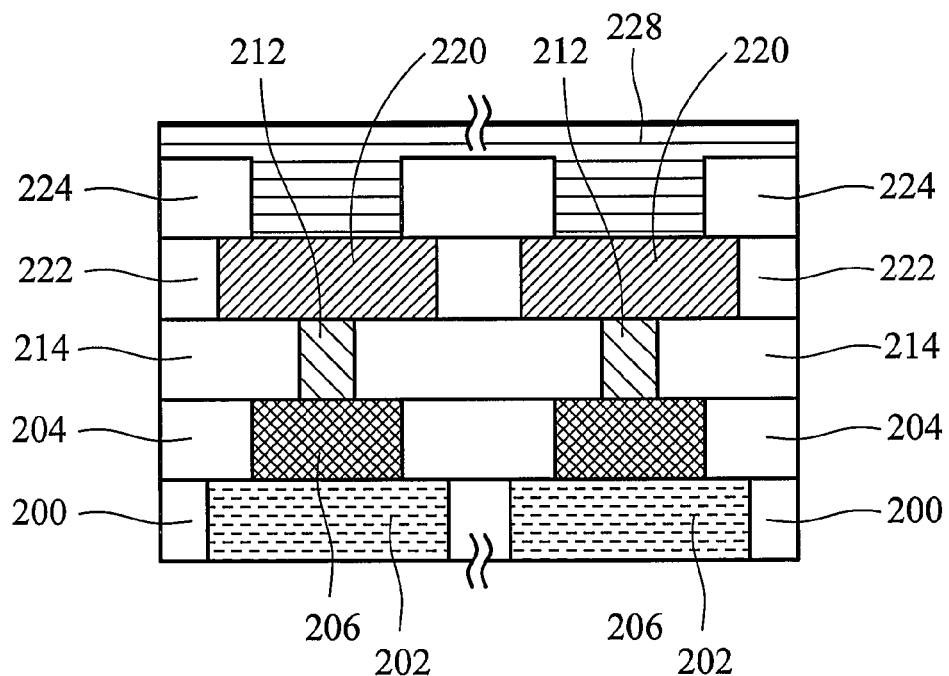

Referring to FIG. 8A, FIG. 8B and FIG. 8C, a third dielectric layer 224 is formed on the strip-shaped phase change layer 220 and the second dielectric layer 222. Next, the third dielectric layer 224 is patterned to form openings 226, exposing portions of the strip-shaped phase change layer 220. Referring to FIG. 9A, FIG. 9B and FIG. 9C, a conductive material (not shown) is deposited on the third dielectric layer 224 and fills the openings. Next, the conductive materials are patterned to form top electrodes 228, electrically connecting the strip-shaped phase change layers 220. Notice that in another embodiment of the invention, relative positions of the strip-shaped phase change layer and the strip-shaped electrode are interchangeable.

Figure 11:
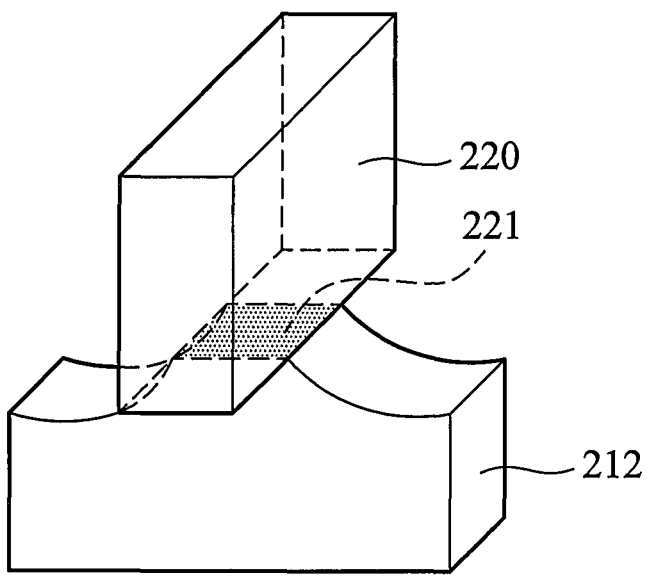
FIG. 11 shows a three dimension view of a phase change memory device of another embodiment of the invention.

Another embodiment of the invention, a phase change memory device comprises a bottom-confined structure. In FIG. 11, the strip-shaped electrode 212 disposed underlying the strip-shaped phase change layer 220 can further be confined in a direction along the strip-shaped electrode 212. Thus, the strip-shaped electrode 212 is two dimensionally confined to the strip-shaped phase change layer 220. Accordingly, due to the two dimensional confined strip-shaped electrode 212 and one dimensional confined strip-shaped phase change layer 220, more current can be gathered to the cross region 221, and the phase change memory device with this structure can have higher efficiency.

Figure 12:
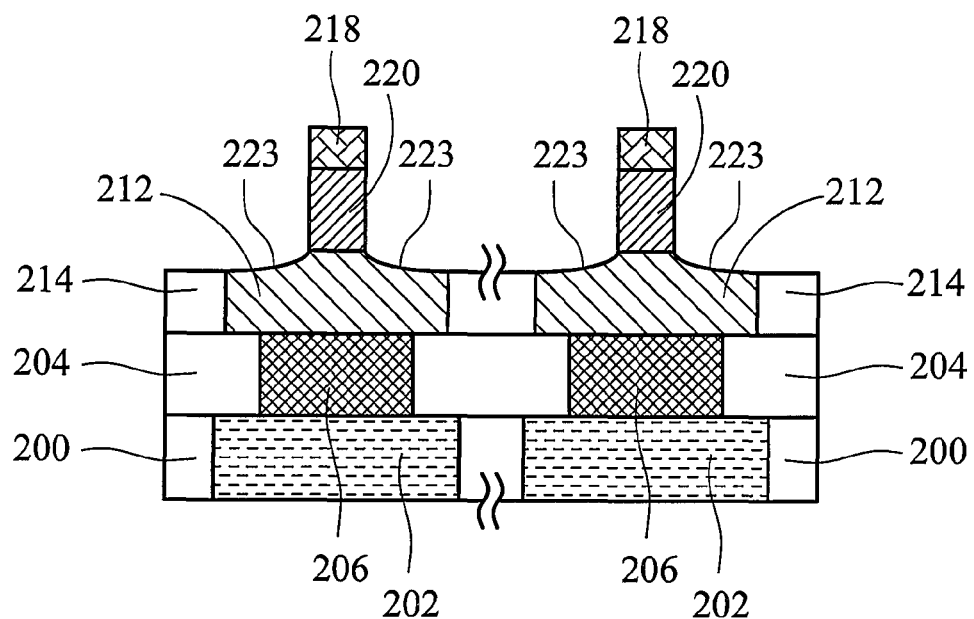
FIG. 12 shows an intermediate cross section of a phase change memory device of another embodiment of the invention.

Process steps for forming the phase change memory device of the structure in FIG. 11 are similar to the previously described embodiments, in which only a few steps are different. The differing steps will be described in accordance with FIG. 12, and FIG. 6B is for comparison. It is understood that the same or the like parts are not described again for simplicity. Referring to FIG. 12, during etching the phase change layer using the patterned photoresist 218 as a mask to form a strip-shaped phase change layer 220, portions of the strip-shaped electrode 212 uncovered by the strip-shaped phase change layer 220 are over-etched to form recess portions 223 on opposite sides of the strip-shaped phase change layer 220. Thus, a bottom-confined structure with strip-shaped electrodes 212 confined to the strip-shaped phase change layer 220 in a direction along the strip-shaped electrode 212 is formed. Note that in another embodiment of the invention, the relative position of the strip-shaped electrode 212 and the strip-shaped phase change layer 220 are interchangeable.

Figure 13:
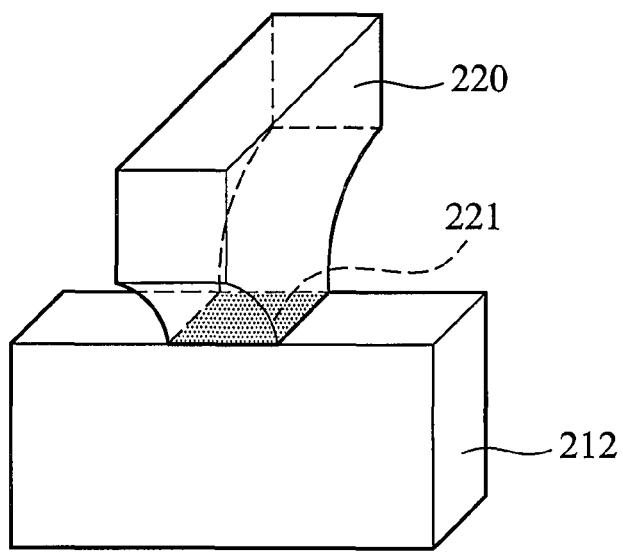
FIG. 13 shows a three dimension view of a phase change memory device of another embodiment of the invention.

Another embodiment a phase change memory device comprises a top-confined structure. In FIG. 13, the strip-shaped phase change layer 220 disposed on the strip-shaped electrode 212 can be confined in a direction along the strip-shaped phase change layer 220 to achieve a two-dimensional confined strip-shaped phase change layer 220. The strip-shaped phase change layer 220 is two dimensionally confined to the strip-shaped electrode 212. Thus, due to the two dimensional confined strip-shaped phase change layer 220 and one dimensional confined strip-shaped electrode 212, more current can be gathered to the cross region 221, and the phase change memory device with this structure can have higher efficiency.

Figure 4A:
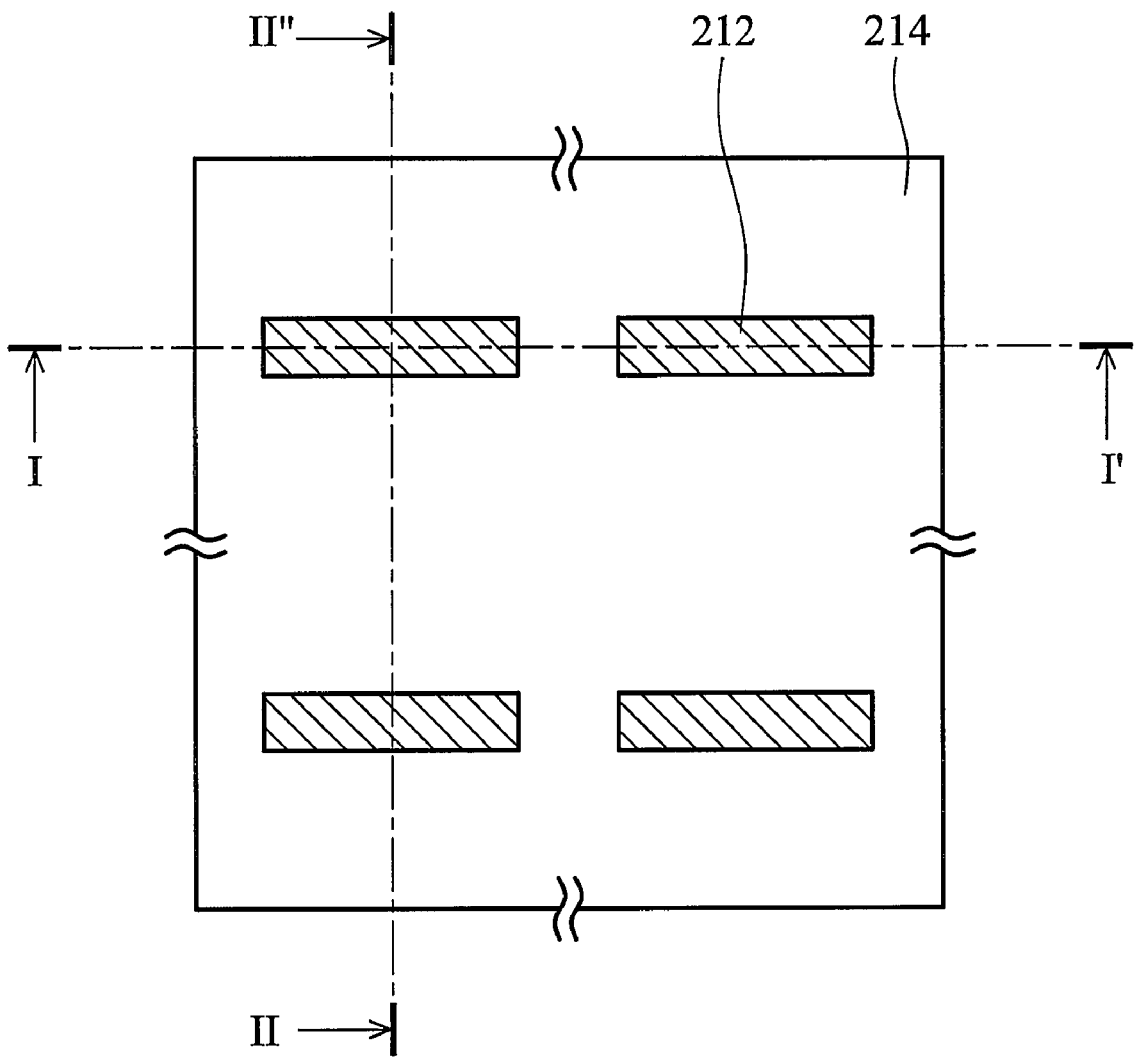
Figure 4B:
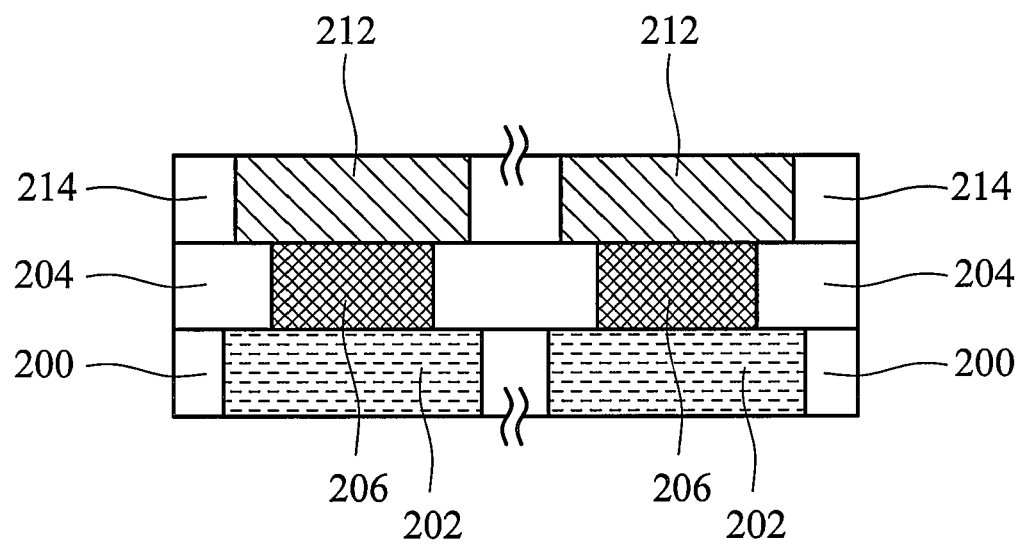
Figure 4C:
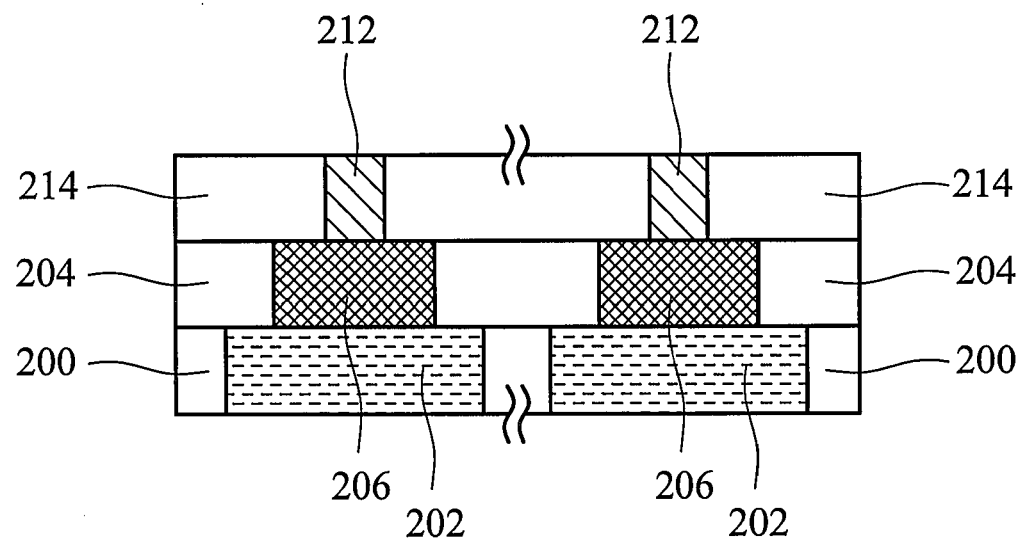
Figure 14:
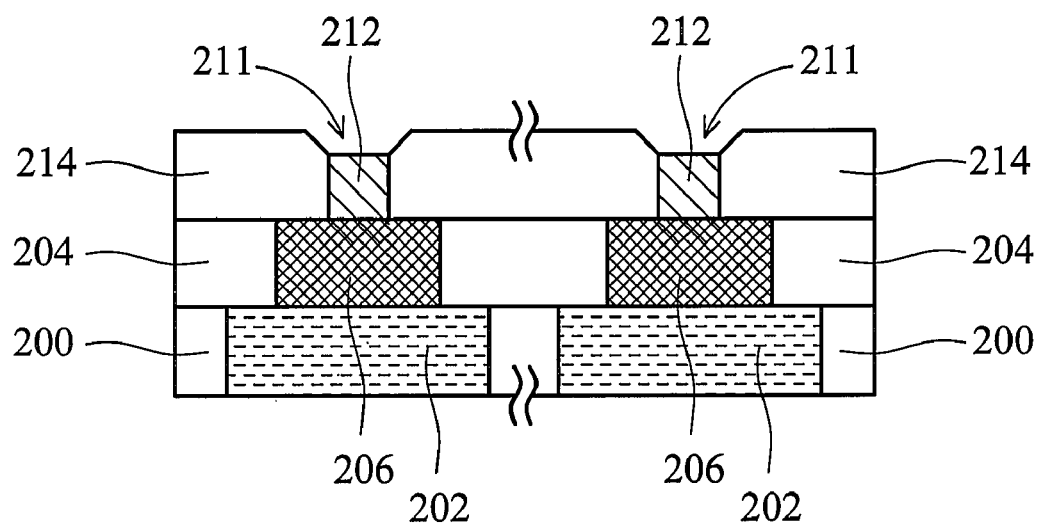
FIG. 14 shows an intermediate cross section of a phase change memory device of another embodiment of the invention.
Figure 15:
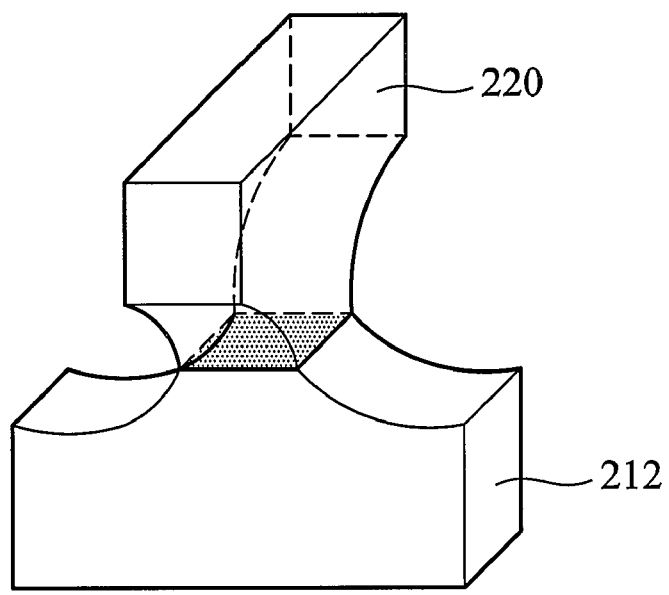
FIG. 15 shows a three dimensional view of a phase change memory device of another embodiment of the invention.

Process steps for forming this phase change memory device are similar to the embodiment described, in which only a few process steps are different. The differing steps are described in accordance with FIG. 14, and FIG. 4C is provided for comparison. A dielectric material, such as silicon oxide, silicon nitride or silicon oxynitride is deposited on the strip-shaped electrode 212, via 206 and the bottom dielectric layer 204, and then polished to expose the strip-shaped electrode 212 and form a first dielectric layer 214. During the polishing step, the strip-shaped electrode 212 is formed with a dishing portion 211 by adjusting parameters, such as rotational speed of a polishing head, content of polishing slurry and/or process temperature, of the chemical mechanical polishing process. A surface of the strip-shaped electrode 212 is lower than that of the first dielectric layer 214. Thus, a top-confined structure with strip-shaped phase change layer 220 confined to the strip-shaped electrode 212 in a direction along the strip-shaped phase change material layer 220 is formed. Note that in another embodiment of the invention, the relative positions of the strip-shaped electrode 212 and the strip-shaped phase change layer 220 are interchangeable.

Another embodiment of a phase change memory device comprises a top and bottom confined structure in which the process steps of FIG. 14 and FIG. 12 can be combined. Referring to FIG. 14, a dielectric material, such as silicon oxide, silicon nitride or silicon oxynitride is deposited on the strip-shaped electrode 212, via 206 and the bottom dielectric layer 204, and then polished to expose the strip-shaped electrode 212 and form a first dielectric layer 214. During the polishing step, the strip-shaped electrode 212 is formed with a dishing portion 211 by adjusting parameters, such as rotational speed of a polishing head, content of polishing slurry and/or process temperature, of the chemical mechanical polishing process. A surface of the strip-shaped electrode 212 is lower then that of the first dielectric layer 214. Therefore, a top confined structure with strip-shaped phase change layer 220 confined to the strip-shaped electrode 212 in a direction along the strip-shaped phase change material layer 220 is formed.

Referring to FIG. 12, during etching the phase change layer using the patterned photoresist as a mask to form a strip-shaped phase change layer 220, a portion of the strip-shaped electrode 212 uncovered by the strip-shaped phase change layer 220 is over etched to form recess portions 223 on opposite sides of the strip-shaped phase change layer 220. Consequently, a top and bottom confined structure is formed. Note that in another embodiment of the invention, the relative positions of the strip-shaped electrode 212 and the strip-shaped phase change layer 220 are interchangeable.

According to the embodiments described, lower resistance of the strip-shaped heating electrode compared to conventional cylinder-shaped electrode, concentration of current to one dimensional confined phase change layer, concentration of current to two dimensional confined phase change layer could be achieved. In addition, due to better mechanical strength of the strip-shaped photoresist, the trimming process could be achieved more easily. Further, since the phase change memory structure can be formed by crossing two strip-shaped structures, the process window of a photolithography for forming this structure is larger, in which a contact region between two strip-shaped structures can be well controlled by precisely defining the width of both of the strip-shaped structures. Further, a phase change memory device with a confined structure could be achieved by adjusting parameters of etching and/or chemical mechanical polishing process, in which additional processes are not required.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A phase change memory device, comprising:
an electrode extending longitudinally along a first direction, wherein the electrode is strip-shaped;
a strip-shaped phase change layer extending longitudinally along a second direction from a first end to a second end, and crossing and contacting the electrode at a cross region, and the phase change layer having a first recess neighboring a first side of the cross region and having a second recess neighboring a second side of the cross region, wherein the first recess extends along the second direction from the first end of the strip-shaped phase change layer to the cross region and the second recess extends along the second direction from the cross region to the second end of the strip-shaped phase change layer such that the first recess and second recess are formed in a cross-sectional profile of the phase change layer taken in a plane parallel to the second direction, and the first recess and the second recess are arranged such that a confined structure of the phase change layer is formed, and a bottom surface of the confined structure directly contacts the electrode; and
a transistor comprising a source and a drain, wherein the drain or source of the transistor electrically connects the electrode or the phase change layer.
2. The phase change memory device as claimed in claim 1, wherein the phase change layer does not comprises a recess at the cross region.

* * * * *